US006360277B1

United States Patent
Ruckley et al.

(10) Patent No.: US 6,360,277 B1
(45) Date of Patent: Mar. 19, 2002

(54) ADDRESSABLE INTELLIGENT RELAY

(75) Inventors: Kevin Ruckley, San Diego, CA (US); Jorge Cooley, Tijuana (MX)

(73) Assignee: Crydom Corporation, San Diego, CA (US)

( * ) Notice: Subject to any disclaimer, the term of this patent is extended or adjusted under 35 U.S.C. 154(b) by 0 days.

(21) Appl. No.: 09/121,026

(22) Filed: Jul. 22, 1998

(51) Int. Cl.[7] .............................................. G06F 15/16
(52) U.S. Cl. ........................ 709/250; 709/230; 710/63
(58) Field of Search ................................ 709/250, 230; 710/63

(56) References Cited

U.S. PATENT DOCUMENTS

| 4,749,992 A | 6/1988 | Fitzemeyer et al. ... 340/870.02 |
| 5,164,875 A | 11/1992 | Haun et al. ................... 361/64 |
| 5,638,295 A | 6/1997 | Lagree et al. ............... 364/492 |

OTHER PUBLICATIONS

Seriplex Control Bus White Paper, distributed by Intelligent I/O for Industrial Control and Data Acquisition.
Cutler–Hammer, Previously Featured Products, Addressable Relay II.
X–10 Powerhouse, Sundowner Controller Model SD533, Set up instructions.

Primary Examiner—John A. Follansbee
(74) Attorney, Agent, or Firm—Gibson, Dunn & Crutcher LLP

(57) ABSTRACT

An addressable process control relay comprises a solid-state relay with an embedded network client. Such client is basically hardware compatible with the physical layer interfaces of a general class of serial networks, and has a variety of down-loadable or embedded protocol personalities that can respond to a particular proprietary network. Such protocol personalities are preferred to include: Fieldbus, process field bus (PROFIBUS), Seriplex, smart distributed system (SDS), DeviceNet, controller area network (CAN), etc.

2 Claims, 3 Drawing Sheets

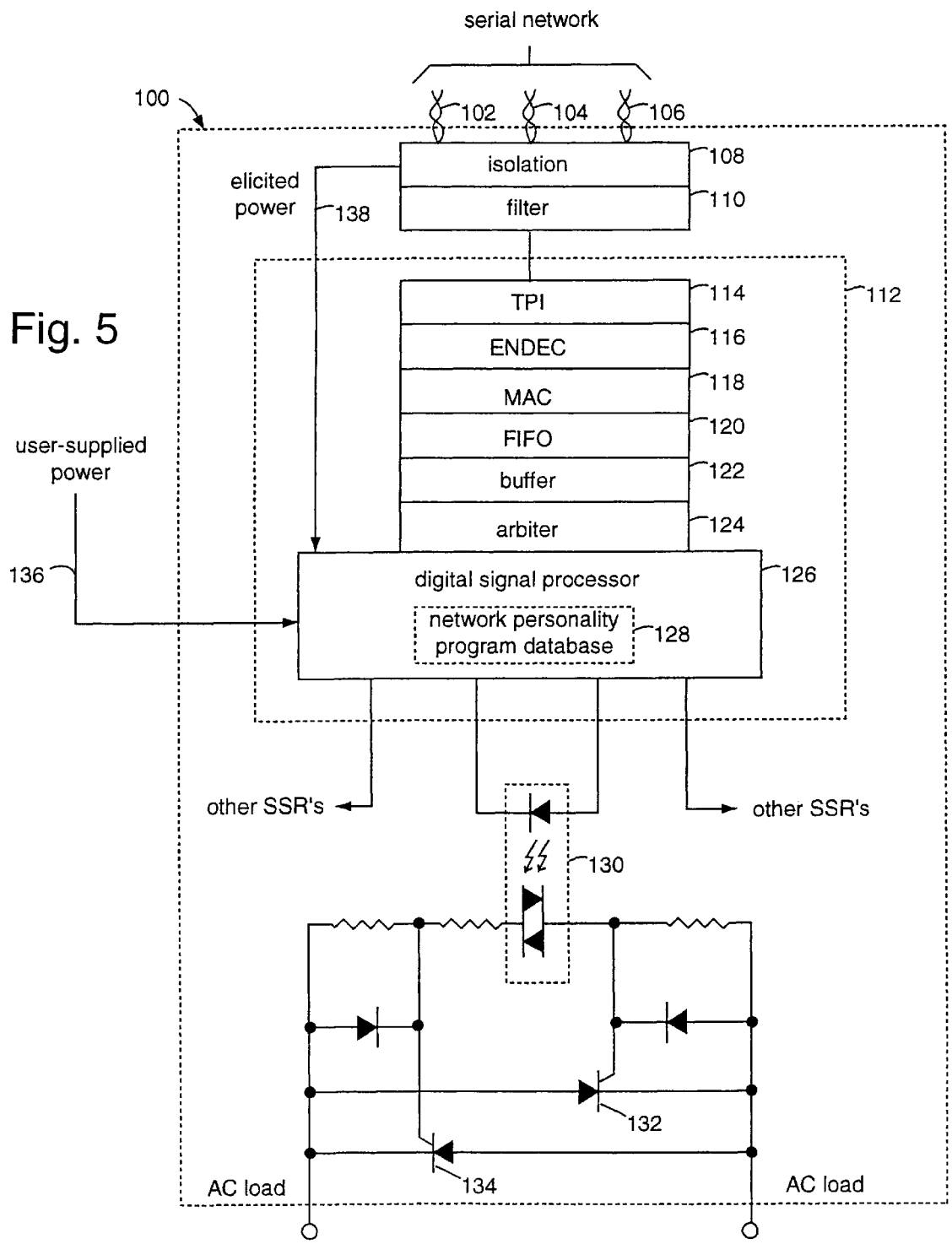

ADDRESSABLE INTELLIGENT RELAY

BACKGROUND OF THE INVENTION

1. Field of the Invention

The invention relates generally to electrical relays and more specifically to integrated solid state relays that are network controlled and therefore have network addresses.

2. Description of the Prior Art

Relays are universally used to control one load in response to one control line. The vast majority of relays are simple, unintelligent devices that simply conduct load current when an input voltage is above some switch threshold. Traditional relays were electromechanical devices in which a solenoid was used to pull-in a set of switch contacts. More recently, solid-state semiconductor devices have been used in so-called "solid-state relays" (SSRs). Input to output circuit isolation has been widely achieved through the use of opto-isolators, e.g., combinations of light emitting diodes (LEDs) and photodetectors. Power MOSFETs, SCRs and TRIACs are very common in the output circuits of such SSRs.

The industrial uses of relays typically involve the switching of high currents, voltages, or powers very near the load itself. This permits relatively light wiring to be run to a controller because the currents, voltages, or powers needed to drive the relay are orders of magnitude less than those of the loads. Even so, such control circuit wiring is limited in how far the controller can be removed from the loads it controls. In modern industrial control applications, the number of control circuits and loads can run into the hundreds. The wiring and the dedicated channels to control hundreds of relays can quickly become impractical and very expensive.

Recently, computers have revolutionized the way control systems are designed and implemented. Micro-controllers, programmable logic controllers (PLCs) and other programmable devices have become ubiquitous in industrial automation. Several manufacturers now offer products with network controlled components. These typically communicate through a network, rather than use traditional hard-wired point-to-point connections between each device and the controller.

As industrial networks have grown in popularity, combining devices from different manufacturers has become a problem because different proprietary communications interfaces and protocols have been used. Such incompatibilities have resulted in various industry-standard topologies and protocols being adopted, e.g., so-called RS-232, RS-485, Fieldbus, PROFIBUS, Seriplex, SDS, DeviceNet and CAN. It is widely believed that strict adherence to industry standards promotes multi-vendor connectivity, such that devices from different manufacturers will automatically work together in the same network.

Even though there is a wide variety of intelligent relay and control devices being marketed, there is no general purpose solid state relay available that combines the intelligence of these protocols with the functionality and versatility of a high capacity relay.

In control systems, relays are used to turn on motors, valves, lights, etc. In prior art systems such relays are driven by a PLC, measurement sensor, parallel output port of a computer, etc. Although this may work fine for applications in which the number of outputs is not a limitation, and where the relays are located physically close to their controller, in others this is less acceptable as the amount of wiring and or multiplexers or multi-controllers becomes prohibitive.

SUMMARY OF THE PRESENT INVENTION

It is therefore an object of the present invention to provide a general purpose solid state relay compatible with standard industrial networks.

It is another object of the present invention to provide a solid-state relay that permits wider control from more centralized supervisory centers.

Briefly, an addressable process control relay embodiment of the present invention comprises a solid-state relay with an embedded network client. Such client is basically hardware compatible with the physical layer interfaces of a general class of serial networks, and has a variety of down-loadable or embedded protocol personalities that can respond to a particular proprietary network. Such protocol personalities are preferred to include: Fieldbus, process field bus (PROFIBUS), Seriplex, smart distributed system (SDS), DeviceNet, controller area network (CAN), etc.

An advantage of the present invention is that an addressable solid-state relay is provided that eliminates the need for otherwise redundant I/O modules, cards, and single-personality addressable relays.

Another advantage of the present invention is that an addressable solid-state relay is provided that simplifies the installation and maintenance of industrial process control systems.

These and other objects and advantages of the present invention will no doubt become obvious to those of ordinary skill in the art after having read the following detailed description of the preferred embodiments which are illustrated in the various drawing figures.

IN THE DRAWINGS

Figure 4:
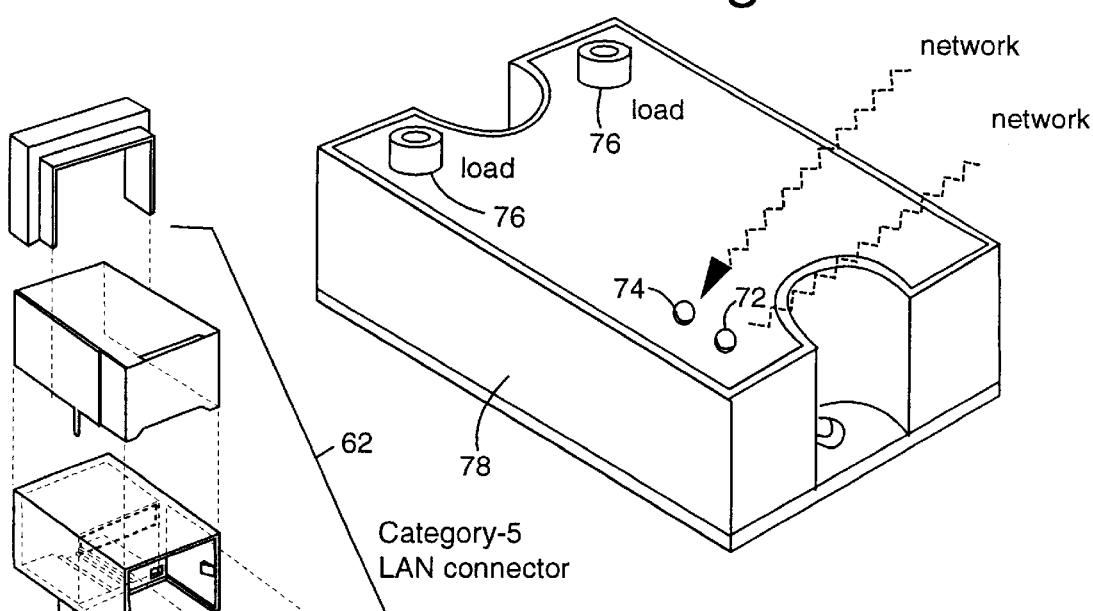

FIG. 4 is a perspective diagram of a solid-state relay embodiment of the present invention which has an optical link input and output for wireless connection to a variety of serial networks; and FIG. 5 is a functional block diagram of an addressable solid-state relay embodiment of the present invention which has a full implementation of the seven-layer ISO model network client interface and a digital signal processor and program database that permit the relay to be addressed from a variety of serial network types common to the process control industry.

DETAILED DESCRIPTION OF THE PREFERRED EMBODIMENTS

Figure 1:
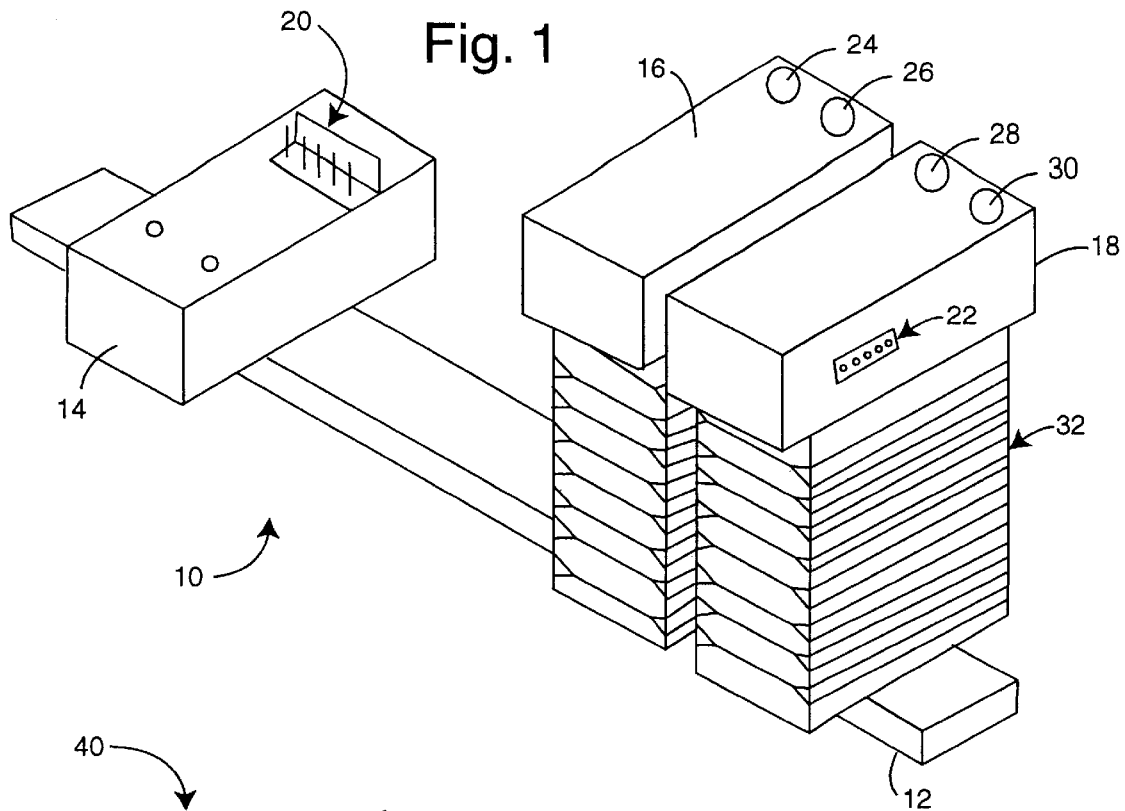
FIG. 1 is a perspective diagram of a solid-state relay bank embodiment of the present invention.

FIG. 1 illustrates a solid-state relay (SSR) bank in a first embodiment of the present invention, referred to herein by the general reference numeral 10. The SSR bank 10 includes a rack 12 which supports a variety of solid-state relays (SSR) 14, 16, and 18. A five-pin connector 20 is provided on SSR 14 for connection to a network controller, e.g., one that has a common physical connection to many SSRs and that addresses each via an electronic address. A similar connector 22 is visible on the side of SSR 18. The output load terminals on SSRs 16 and 18 are represented by a set of lugs 24, 26, 28, and 30. For various applications, the SSRs may include a heatsink 32.

Figure 2:
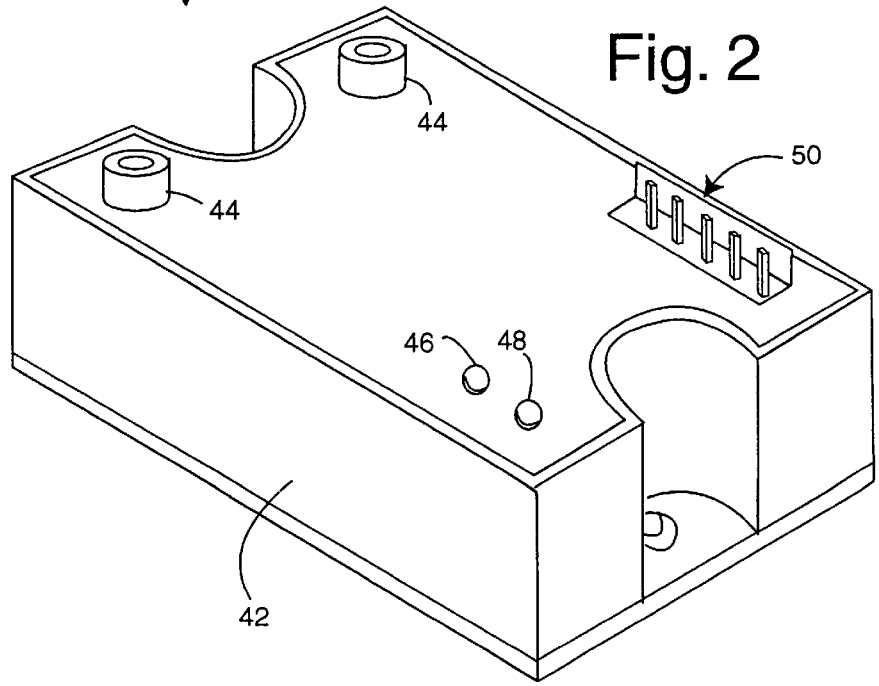
FIG. 2 is a perspective diagram of a solid-state relay embodiment of the present invention included in the bank of SSRs shown in FIG. 1.

FIG. 2 represents an SSR 40 and is similar to SSR 14 in FIG. 1. A plastic case 42 is potted with the operational electronics inside. A pair of load terminals 44 provide a single-pole single-throw switch output. A pair of light emitting diodes (LED's) 46 and 48 provide status output. A five-pin connector 50 is provided on SSR 40 for connection to a network controller via ubiquitous EIA-type RS-232 or RS-485 interfaces to networks based on Fieldbus, process field bus (PROFIBUS), Seriplex, smart distributed system (SDS), DeviceNet, controller area network (CAN), Foundation Fieldbus, HART, Interbus, LonWorks, Modbus, P-Net, WorldFip, etc. Each such network mentioned is an industry standard widely supported with hardware, software, and in some cases, specialized integrated circuits.

Fieldbus is a digital communication link between control systems and attached digital devices. The development and increasing use of intelligent field devices in the 1980s led to the need to replace the 4–20 mA current loop standard with an open, vendor-independent, multi-drop, bi-directional digital communication system, commonly known as Fieldbus, there was also a growing need to integrate the various microprocessor-based intelligent field devices so that users can take full advantage of a field network. It has emerged to revolutionize the control environment and device characteristic in both process and manufacturing industries. Fieldbus protocol is based on International Standards Organization (ISO) reference model for open system interconnection (OSI-RM), ISO 7498. However, Fieldbus uses only layers 1, 2, 7 of OSI-RM, layer 3 through 6 are bypassed for real-time purpose. There is also a new user layer added on top of the application layer, where distributed control strategy is implemented and which makes Fieldbus much more than a communication network. There are a wide variety of competing bus systems in the market, which mainly focus on part of the overall system. The current Fieldbus market can be described as "segmented into layers" according to the degree of complexity correlated with average packet sizes needed to communicate with devices, which can be further classified into three categories: Sensorbus (bit-level), Devicebus (byte-level), and Fieldbus (block-level with full data and process control). PROFIBUS, WorldWIP and P-NET have been selected as European standard EN 50170 for general purpose field communication systems.

PROFIBUS specifies the technical and functional characteristics of a serial Fieldbus system with which decentralized digital controllers can be networked together from the field level to the cell level. PROFIBUS distinguishes between master devices and slave devices. Master devices determine the data communication on the bus. A master can send messages without an external request when it holds the bus access rights (the token). Masters are also called active stations in the PROFIBUS protocol. Slave devices are peripheral devices. Typical slave devices include input/output devices, valves, drives and measuring transmitters. They do not have bus access rights and they can only acknowledge received messages or send messages to the master when requested to do so. Slaves are also called passive stations, since they only require a small portion of the bus protocol, their implementation is particularly economical.

The Seriplex control bus is a deterministic, serial multiplexed, intelligent, distributed I/O system, providing both master/slave and peer-to-peer I/O control and logic. The Seriplex network cable connects to I/O devices in one of two ways: directly to devices that contain an embedded Seriplex application-specific integrated circuit (ASIC) through general-purpose I/O blocks that contain the Seriplex ASIC or the ASIC, or chip, provides the communication capability, addressability and the intelligence to execute logic in virtually any sensor or actuator. The control bus supports binary and analog device communication, and has the added capability of serial digital communication, such as RS-232 and RS-485. Hardware and installation cost savings are achieved by placing I/O blocks as close to the point of I/O device use as possible. Communication takes place over a four wire, low voltage cable. The Seriplex control bus eliminates the thousands of parallel wires usually run through conduit from local control cabinets to I/O devices, such as thermocouples, push buttons, proximity switches, photoelectric sensors, valves, solenoids, contactors, thermal sensors, etc. In addition to the material cost savings, there is a significant labor savings, as well. The labor cost to install a small, four-wire cable the size of a little finger that does not require conduit is a mere fraction of the cost of installing conduits, pulling a multitude of control wires through them and then trying to identify and terminate the individual circuits. The Seriplex control bus transmits both digital and analog I/O signals in real time for both control and data acquisition applications. It combines distributed and local I/O capability on the same bus. The control bus is designed to compliment rather than compete with the higher level, more sophisticated protocol, Fieldbus type communication systems, that are best suited to transmitting large information data packets. It resides primarily at the physical device level providing deterministic, process critical, real time I/O updates needed by most control systems, and leaves the higher level communication not requiring fast throughput rates to others.

There are two versions of the Seriplex ASICs, either of which could be embedded in the SSR 40. The two ASICs are similar in function and the second generation SPX-SP256-2B is downward compatible with the first generation SPX-256 ASIC.

They can both reside on the same system, as long as the bus voltage is +12 VDC. The SPX-SP256-2 also operates at +24 VDC. The ASICs are programmed differently. The first generation ASIC requires a programming port on the I/O block or I/O device into which it is embedded. The SPX-SP256-2B is programmed by connecting the programmer to the four-bus conductors. This is an economical connection that does not require additional real estate for the programming port. ASICs are generally programmed with a hand held set-up tool for addresses, logic function and mode of operation. Addresses are entered as integer numbers at the Set-Up Tool's address prompt. Each ASIC has two physical inputs (A and B) and three physical outputs (A, B and C). Logic is programmed by setting each input and output point in the ASIC to a normally-inverted or non-inverted state by means of the ASIC's on-board non-volatile memory. The C output is available as a logical function of A and B outputs. Unlike the A and B outputs, output C is not directly addressable from the bus. Generally, either the C or B output may be used on an I/O block. This selection is usually made via a jumper located on the I/O block. The choice of B or C output on an I/O device with an embedded ASIC is usually set at the design level within the device. Additional logic functions can be programmed into the second generation ASIC. One of these enhancements, digital debounce, allows for sampling data once, twice or three times on consecutive bus scans. The data must be identical on each of the selected number of scans before it is passed to physical outputs. Both ASICs can operate in master/slave or peer-to-peer mode. This is determined at the time of programming. This selection. determines how the ASIC handles data. In the master/ slave mode, data is passed from the inputs to the data line and delivered to the host CPU application program so it is acted upon based on the logic in that program. The result of that logic is transmitted over the data line to turn output devices on or off as appropriate.

DeviceNet is a low-cost communications link to network-connect industrial devices, e.g., limit switches, photoelectric sensors, valve manifolds, motor starters, process sensors, bar code readers, variable frequency drives, panel displays and operator interfaces. The direct connectivity provides improved communication between devices as well as important device-level diagnostics not easily accessible or available through hardwired I/O interfaces. The DeviceNet communication link is based on a broadcast-oriented, communications protocol, the controller area network (CAN). The CAN protocol has fast response and high reliability for applications as demanding as control of anti-lock brakes and air-bags. Chips are available in a variety of packages with high temperature ratings and high noise immunity, attributes well suited for the industrial automation market as well.

DeviceNet incorporates CAN which defines the syntax or form of the data movement. The DeviceNet application layer defines the semantics or meaning of the data moved. DeviceNet is an Application Layer Protocol (ISO Layer 7), e.g.:

| DeviceNet Protocol | ISO Application (Layer 7) |
|---|---|
| CAN Protocol | ISO Data Link (Layer 2) |
| Physical Layer | ISO Physical (Layer 1) |
| Transmission Media | ISO Media (Layer 0) |

Communication protocol features peer-to-peer data exchange in which any DeviceNet product can produce and consume messages. Master/slave operation is defined as a proper subset of peer-to-peer. A DeviceNet product may behave as a client or a server or both. A DeviceNet network may have up to sixty-four media access control identifiers (MAC IDs) node addresses. Each node can support an infinite number of I/O. Typical I/O counts for pneumatic valve actuators are sixteen or thirty-two. The object model A DeviceNet node is modeled as a collection of objects. An object provides an abstract representation of a particular component within a product. The realization of this abstract object model with a product is implementation dependent. An object instance and an object class have attributes (data), provide services (methods or procedures), and implement behaviors. Attributes (1-255), instances (0-6535), class (1 65535) and address (0-63) are addressed by number.

The CAN is a serial data communications bus for real-time applications. CAN operates at data rates of up to one megabit per second and has excellent error detection and confinement capabilities. CAN was originally developed by the German company Robert Bosch for use in the car industry to provide a cost-effective communications bus for in-car electronics and as alternative to expensive and cumbersome wiring looms. Now, because of its proven reliability and robustness, CAN is being used in many other automation and industrial applications. CAN is now an international standard and is documented in ISO 11898, for high-speed applications, and ISO 11519 for lower-speed applications. Low-cost CAN controllers and interface devices are available as off-the-shelf parts from several of the leading semiconductor manufacturers. Custom built devices and popular microcontrollers with embedded CAN controllers are also available. There are many CAN-related system development packages. Hardware interface cards and easy-to-use software packages provide system designers, builders and maintainers with a wide range of design, monitoring, analysis, and test tools.

Figure 3:
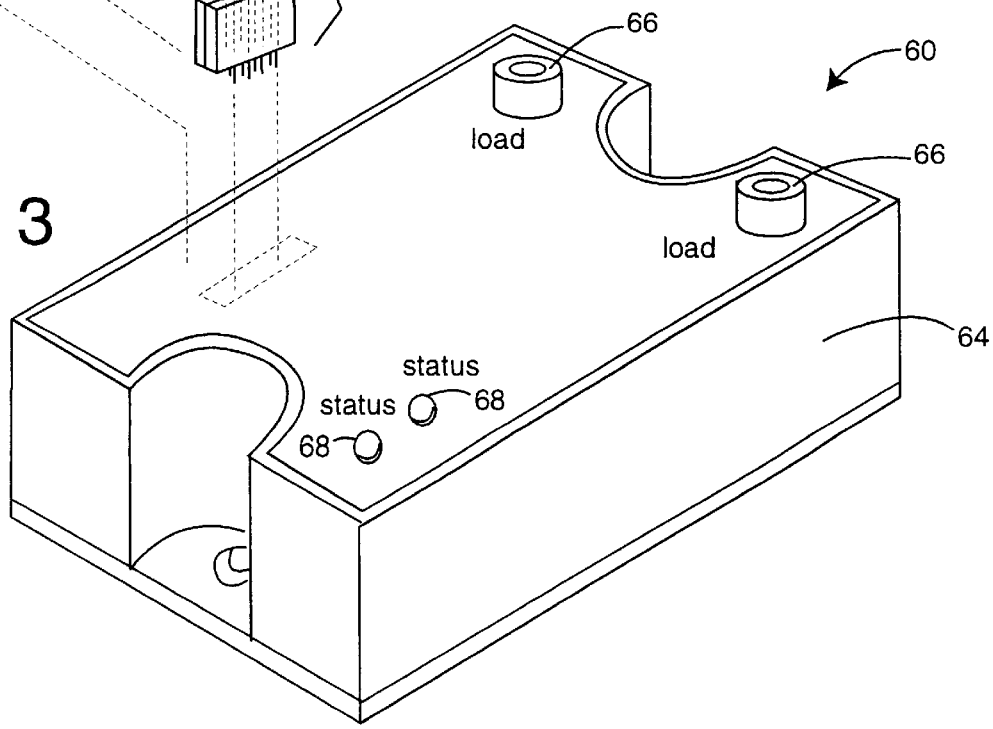
FIG. 3 is a perspective diagram of a solid-state relay embodiment of the present invention which has a class-5 RJ-45 type connector for a LAN.

FIG. 3 represents an SSR 60 and is similar to SSRs 14, 16, and 18 in FIG. 1 and SSR 40 in FIG. 2. A Category-5 RJ-45 connector 62 provides the physical connector to a local area network (LAN) such as Ethernet. A plastic case 64 is potted with the operational electronics inside. A pair of load terminals 66 provide a single-pole single-throw switch output. A pair of light emitting diodes (LEDs) 68 provide status output. So, instead of having a standard two-wire voltage level control, these addressable relays will have a communications port from which they can be accessed by the controller through the network with its unique component address, to modify its output state.

Having an addressable relay allows for a larger number of relays in a system. This in turn reduces the interconnect wiring. This reduces the cost of the controller and the hardware, enhancing the system's functionality and operation, increasing its connectivity and portability.

For a communication protocol on which data can be transferred to and from the devices, the relay can do more than switching on and off. Semi-intelligent and intelligent functions are possible for different models, such as: monitoring alarms, phase controlling of the line, cycle skipping, temperature controlling and or monitoring, intensity control, turn on or turn off delays.

Simple network management protocol (SNMP) is an application protocol for network management services in the internet protocol suite. SNMP has been adopted by numerous network equipment vendors as their main or secondary management interface. SNMP defines a client/server relationship, wherein the client program, a "network manager", makes virtual connections to a server program, an "SNMP agent", on a remote network device. The data base controlled by the SNMP agent is the SNMP management information base, and is a standard set of statistical and control values. SNMP and private MIB's allow the extension of standard values with values specific to a particular agent. Directives issued by the network manager client to an SNMP agent comprise SNMP variable identifiers, e.g., MIB object identifiers or MIB variables, and instructions to either "get" the value for the identifier, or "set" the identifier to a new value. Thus private MIB variables allow SNMP agents to be customized for specific devices, e.g., network bridges, gateways, and routers. The definitions of MIB variables being supported by particular agents are located in descriptor files, typically written in abstract syntax notation (ASN.1) format. The definitions are available to network management client programs.

SNMP enjoys widespread popularity, and SNMP agents are available for network devices including computers, bridges, modems, and printers. Such universal support promotes interoperability. The SNMP management protocol is flexible and extensible, SNMP agents can incorporate device specific data. Mechanisms such as ASN.1 files allow the upgrading of network management client programs to interface with special agent capabilities. Thus SNMP can take on numerous jobs specific to device classes such as printers, routers, and bridges. A standard mechanism of network control and monitoring is thus possible.

Unfortunately, SNMP is a complicated protocol to implement, due to complex encoding rules, and it is not a particularly efficient protocol. Bandwidth is often wasted with needless information, such as the SNMP version that is to be transmitted in every SNMP message, and multiple length and data descriptors scattered throughout each message. SNMP variables are identified as byte strings, where each byte corresponds to a particular node in the MIB database. Such identification leads to needlessly large data handles that can consume substantial parts of each SNMP message.

Most vendors implement network managers thinking a user's primary interest is in the data associated with particular network devices. But such data is easily acquired by other means, e.g., "netstat" and "rsh" UNIX programs. The important information about the network includes the differences between devices, besides their current states. SNMP affords a good mechanism for rapidly processing such differences on large networks, since SNMP avoids the processing burden of remote login and execution.

Network management applications can thus monitor the health of every part of a global communications network and can be set to communicate alarms to a central management console. Current network management applications do an adequate job of informing central management consoles about the health of various nodes in the network and the alarms they issue when a node is failing are useful.

Conventional SNMP network management technologies do not provide sufficient information related to the nodes' electrical power status. A new technology is needed that can be simply and inexpensively added to client equipment nodes for SNMP reporting of the electrical power status of the node. For example, in a router based network with SNMP support, prior art individual routers can use SNMP to issue an alarm to the management console. But the console operator would know only that the router is failing. A "get" command can be issued to the router node to determine if the counter and buffer thresholds limits were exceeded and caused a router to lock-up. However, the console operator does not have any information about the electrical power status to the router, e.g., has the router power switch been moved to the off position or has the switch been accidentally turned off? The electrical power source could have failed, the power cable connection become loose, or a technician may have accidentally removed the router from a rack.

In a simple network management protocol (SNMP) network, a host with a TCP/IP connection is connected by wire to a plurality of point-of-presence (POP) nodes. SNMP network management is provided by a SNMP manager in communication with a respective pair of SNMP agents at remote nodes. The SNMP manager may comprise a commercial product such as IBM Netview/6000, HP Openview, Polycenter, SunNet Manager, Cabletron Spectrum, etc.

SNMP defines a client/server relationship. The client program, network manager, makes virtual connections to the server program, the SNMP agent on a remote network device. The database controlled by the SNMP agent is the management information base (MIB). The MIB is a standard set of statistical and control values that provides information about the attributes of devices attached to the network. SNMP allows for the extension of these standard values with values that are specific to a particular SNMP agent through the use of private MIB's. The use of private MIB variables allows SNMP agents to be modified for a variety of devices, e.g., bridges, hubs, routers and CSU/DSUs, etc. SNMP operates by exchanging network information through protocol data unit (PDU) messages. PDU's carry variables that have both titles and values. There are five types of PDU's that SNMP uses to monitor a network, two for reading terminal data, two for setting terminal data, and one, the trap, for monitoring network events. Every SNMP message consists of a variable, and every variable consists of a variable title, the integer, string data type of the variable, whether the variable is read-only or read-write, and the value of the variable.

The SNMP manager collects information via MIB's about routers, hubs, bridges, concentrators, servers, switches and other inter-networking devices. When a problem at a remote node is detected, the corresponding SNMP agent issues an alarm that identifies the problem by type and node address. The SNMP manager typically sends a Telnet script to a TCP/IP-addressable enterprise power manager. The Telnet script instructs the enterprise power manager to cycle the power cycle, to recover an otherwise locked-up network device. SNMP management is not required for the enterprise power manger and the associated intelligent power modules. The intelligent power modules include normally closed relays so power is always on except when the relay is deliberately opened to trigger a power on reset and reboot. The network management application monitors the UPS and the inter-networking devices.

The load sensor and power-on sensor can be combined such that a console operator can determine if electrical power is available to an equipment rack and to an individual inter-networking device. A relay reset located between the power source and the client equipment node supports an SNMP-type "set" command that can be defined to open and close a relay to power-cycle the inter-networking device. Such power-cycling can clear a lockup condition and allow the device to return to normal operation via its own internal power-up reset mechanism.

A console operator can be notified by conventional means that a router is failing. A determination then needs to be made that the,electrical power is available to the equipment rack and to an individual inter-networking device. The next action would be to try to power-cycle an individual inter-networking device to return it to operational status.

Global communication network operators, located at a few centralized network management centers, are relying more and more on automated network management applications to analyze, process, display and support their networks. An increasing number of network management software applications are being marketed that use open-system standardized protocols. Particular network application tool software is available to report lists of the inter-networking devices, by location, and can issue trouble lists and keep track of software versions and releases. New simple network management protocol (SNMP) applications are conventionally used to issue alarms to central management consoles when remote inter-networking devices fail.

One such SNMP network management application is marketed by Hewlett-Packard. HP Openview is a family of network and system management tools and services for local and wide area multi-vendor networks. Openview is a management platform that provides application developers and users with the ability to manage multi-vendor networks and expand their distributed computing environments. Openview allows network operation centers to build an intelligent hierarchical network management application, and uses open standards such as SNMP, user datagram protocol (UDP), and the now ubiquitous transmission control protocol/internet protocol (TCP/IP). Because Openview is built on open system standards, global communication network operators can easily integrate the various inter-networking equipment nodes into a managed environment operated by strategically located network consoles.

In order to provide a reliable computing environment, a robust and active process for problem resolution must be in place. Openview allows the definition of thresholds and monitoring intervals, and the interception of network, system, database, and application-messages and alerts. Once a threshold value is exceeded, intelligent agents can run a pre-defined automatic action and/or generate and send a message to alert an operator on a central management console. Messages can also be forwarded to a pager or trouble-ticketing application. To help focus on the most critical problems, a message browser window is used to display six severity levels for incoming problems and events, e.g., ranging from stable to critical. An integrated history database is provided for auditing and analyzing system and network activities, for identifying trends and for anticipating problems before they occur. Activity displays and reports can be customized by the users.

Prior art SNMP network management uses embedded microprocessors in almost every inter-networking device to support two-way inter-computer communications with TCP/IP, of which SNMP is a member of the TCP/IP protocol suite. SNMP is conventionally used to send messages between management client nodes and agent nodes. Management information blocks (MIB's) are used for statistic counters, port status, and other information about routers and other network devices. "Get" and "set" commands are issued from management consoles and operate on particular MIB variables for the equipment nodes. Such commands allow network management functions to be carried out between client equipment nodes and management agent nodes.

Highly reliable networks are critical to the success of the enterprise, so ease of installation and support are primary considerations in the choice of network technology. Since the introduction in 1986 of star-wired "10BASE-T" hubs, structured wiring systems have continued to evolve and hubs and switches have become increasingly reliable. Today, Ethernet networks are rapidly approaching the reliability level associated with their telephone ancestors, and are relatively simple to understand and administer.

Ethernet technology is ubiquitous. More than eighty-three percent of all installed network connections were Ethernet by the end of 1996 according to IDC Corporation. This represents over one hundred twenty million interconnected personal computers, workstations and servers. The remaining network connections are a combination of token ring, fiber distributed data interface (FDDI), asynchronous transfer mode (ATM) and other protocols. All popular operating systems and applications are Ethernet-compatible, as are upper-layer protocol stacks such as transmission control protocol/internet protocol (TCP/IP), IPX, NetBEUI and DECnet.

Network interface connections have conventionally included some form of signal conditioning near the RJ-45 category-3 or category-5 modular connector. The usual purpose is to block spurious signals, e.g., high frequency noise, differential-mode direct current (DC), and common mode voltages. Various magnetics assemblies from Halo Electronics (Redwood City, Calif.) like the Ultra™ series of 16-pin SOIC isolation modules are used to meet the requirements of IEEE Standard 802.3 for 10/100BASE-TX and ATM155 applications. A very informative background on connectors and their network applications, and a long citation of prior art, is provided by John Siemon, et al., in U.S. Pat. No. 5,474,474, issued Dec. 12, 1995. Such patent is incorporated herein by reference.

Personal computers and engineering workstations are conventionally inter-tied into local area networks (LAN's) that allow messages to be sent and programs to be downloaded, e.g., from file servers on the LAN. The Ethernet, originally a joint effort of Intel, Xerox and Digital Equipment Corporations, is an example of a shared-access LAN now in widespread use. The Ethernet was originally conceived as a ten megabit per second (Mbps) network that allowed every node on the LAN to transmit and receive. Collisions of data occur when two nodes try to transmit at the same time. Such conflicts are resolved by postponing each re-transmission after a random waiting period.

Many variations in Ethernet have been subsequently developed. Different kinds of Ethernet are referred to as "10BASE-T", "10BASE-2", "10BASE-5", "100BASE-VG", and "100BASE-X". Different speeds include ten Mbps, twenty Mbps, one hundred Mbps, and beyond. Different modes of Ethernet also exist, e.g., conventional half-duplex, and full-duplex Ethernet switch (FDES). The present invention contributes a new collisionless mode and operational speeds as high as 320 Mbps.

Single-chip integrated circuit devices are sold commercially that provide the Ethernet function in a convenient form that is easy to integrate on to a plug-in LAN adapter board. Such network interface controllers (NIC's) make no distinction between the interface of a server and a client. However, servers are typically at the focus of network activity and are often subjected to parallel access requests from clients which have the same data transfer speed limitations as the server itself.

FIG. 4 represents an SSR 70 which is controlled and reports via infrared light signals even in a large population of such SSR's. A light emitting diode (LED) 72 provides a status communication output and a photodetector diode 74 provides a control input for a infrared light channel. A pair of load terminals 76 provide a single-pole single-throw switch output. A plastic case 78 is potted with the operational electronics inside. Various kinds of serial network protocols, ranging from the simple to the complex, can be incorporated within. It would even be possible, in this case, to adopt a consumer electronics wireless remote control standard so that SSR 70 could use commercially available integrated circuits marketed around the world.

A so-called "seven layer network communications model" that is universally used to communicate between most types of computer networks is defined by the International Organization of Standards (ISO). Every layer is defined to rely on all its lower, more rudimentary layers to complete its communication jobs. Such seven layers are labeled the application, presentation, session, transport, network, data link, and physical layers. For example, e-mail is a task of the application layer. The application layer uses all of the layers below it to deliver particular e-mail messages to their destinations. The presentation layer formats the look of the e-mail, and the physical layer actually transports the binary data across the network. For more information, see, Naugle, Matthew G., *Local Area Networking*, (McGraw-Hill: New York), 1991.

A systems-oriented network interface controller (SONIC) with a twisted pair interface is marketed by National Semiconductor (Santa Clara, Calif.) in a single integrated circuit as the "DP83934 SONIC™-T". The SONIC-T is a second generation Ethernet controller for sixteen and thirty-two bit system interfacing. A high speed direct memory access (DMA) controller takes five percent of the bus bandwidth and selectable bus mode provide for big-endian and little-endian byte ordering. A linked-list buffer manager permits a range of uses from personal computer (PC) oriented adapters to high-speed motherboard designs. A fully compatible Institute of Electrical and Electronic Engineers (IEEE) standard number 802.3 (IEEE 802.3) encoder/decoder (ENDEC) and a twisted pair interface (TPI) allow a one chip 10BASE-T Ethernet solution. A National DP8392 coaxial transceiver interface permits the construction of 10BASE2 or 10BASE5 systems. The buffer manager processes receive and transmit packets in the system memory, therefore eliminating intermediate packet copying. The receive buffer manager uses three areas in memory for additional resource allocation, status indication, and packet data buffering. The Sonic-T stores received packets in the buffer area and indicates the receive status and control information in a descriptor area. The transmit buffer manager uses two memory areas, one for status and control indication and the other for fetching packet data.

Conventional SONIC single-chip devices include a TPI, an ENDEC, a media access controller (MAC) unit, separate receive and transmit first-in first-out (FIFO) registers, a system buffer management engine and a user programmable system bus interface unit. Pipelined architectures are used to increase system-level performance. The TPI has five main logic units: a smart squelch, a collision detector, a link detector/generator, a jabber and a transmitter. The smart squelch determines if valid data is present at the inputs. The collision detector checks for simultaneous data transmission and reception on the inputs and outputs. The link detector/generator checks the cable integrity. The jabber prevents the transmitter from outputting too long a packet. The transmitter uses summing resistors and a transformer/filter to output Manchester encoded data. The ENDEC interfaces between either the TPI or the Ethernet transceiver and the MAC unit. It provides Manchester data encoding and decoding functions for IEEE 802.3 Ethernet, so called Thin-Ethernet, or twisted-pair types of LAN's. The ENDEC combines non-return to zero (NRZ) data from the MAC unit and clock pulses into Manchester data and sends the data differentially to the transmitter, e.g., in the TPI. During reception, a digital phase locked loop (DPLL) decodes the Manchester data into NRZ-formatted data and into a receive clock. The MAC unit controls media access of transmitting and receiving packets. The MAC unit frames information from a transmit FIFO for transmission and sends serialized data to the ENDEC. The transmit FIFO is arranged as a four-byte wide and eight deep memory array. Incoming information from the ENDEC is de-serialized and frame-checked for validity. Received data is transferred to a receive FIFO. The receive FIFO is also arranged as a four-byte wide and eight deep memory array. Control and status registers are used to manage the MAC unit. The host interface of the SONIC chip has two parts, the control part and the data part. The control part consists of sixty-four addressable registers, an interrupt line, a reset signal, and a chip select line. The data part of the interface uses the DMA transfers between the FIFO's in the SONIC chip and the host memory.

In conventional SONIC devices, a content addressable memory (CAM) is included in the MAC receiver to assist an address recognition unit. A CAM address mismatch causes a packet to be rejected whenever the destination address in the packet does not match an address stored in the CAM. When matches do occur, a de-serializer passes a packet remainder to the receive FIFO. A protocol state machine is included in the MAC transmitter to enforce the carrier sense multiple access with collision detection (CSMA/CD) protocol of the Ethernet. The carrier sense and collision signals are monitored for network activity. Transmission is deferred if the network is busy. Otherwise, an inter-frame gap timer (9.6 microseconds) times-out and transmission begins. Any network activity detected in the first 6.4 microseconds will restart the timer. Otherwise, network activity is ignored and transmission begins at the end of the current 9.6 microsecond period. If a collision with another transmitter is then detected, a four-byte jam pattern of all ones is immediately substituted before terminating the failed transmission. A random number of times slots is inserted as a wait period, where each time slot is 51.2 microseconds. A truncated binary exponential back-off algorithm is used to determine when another transmission should be attempted.

In addition to the ten Mbps Ethernet chips, there are two industry groups working on one hundred Mbps Ethernet chips using unshielded twisted pair (UTP) based cabling. One group is known as the "Fast Ethernet Alliance", and is spearheaded by a company called Grand Junction. Its technology is known as the 100-Base-X which uses two pairs of category-five UTPs and a revamped CSMA/CD protocol. The other group is known as the "100VG-AnyLAN group", and is spearheaded by Hewlett-Packard Corporation. This technology uses four pairs of category-three UTPs to achieve a one hundred Mbps speed. An IEEE committee has sanctioned the technology as the "802.12 standard", and its cabling scheme is referred to as the "100-Base-VG standard". Unfortunately, the one hundred Mbps technology requires an expensive new cable system, has been slow in gaining wide acceptance, and the chip sets are not currently available.

In FIG. 5, an addressable solid-state relay (SSR) 100 implements the hardware and software needed to support the International Standards Organization (ISO) reference model for open system interconnection (OSI-RM), ISO 7498. A serial network, e.g., Ethernet, Fieldbus, process field bus (PROFIBUS), Seriplex, smart distributed system (SDS), DeviceNet, controller area network (CAN), etc., is connected via twisted pairs 102, 104, and 106 to an isolation layer 108. Such wires provide network ground, power, RX clock, TX clock, RX data and TX data. A filter layer 110 provides some signal cleanup that is critical in very high-speed networks like 100-BASE-VG. A network interface controller (NIC) 112 includes a twisted pair interface (TPI) 114, an encoder-decoder (ENDEC) 116, a media access controller (MAC) 118, a first-in-first-out register (FIFO) 120, a data buffer 122, and an arbiter 124. Depending on which network type is being engaged, less than all the layers 114–124 may be active.

A digital signal processor (DSP) 126 or RISC processor personalizes the NIC 112 according to a selected network personality in a program database 128. Preferably, the program database 128 includes a plurality of network personality software modules that can be selected to suit the particular network that the addressable SSR 100 is connected to. Such plurality of network personality software modules can be preloaded in bank, preloaded singlely, or dynamically downloaded in the field during initialization or run-time. The DSP 126 controls an opto-isolator 130 which, in turn, controls the triggering of a cross-connected pair of silicon-controlled rectifiers 132 and 134. Other SSR's nearby can also be controlled or monitored by the NIC 112. Alternatively, user supplied power can be connected with a wire 136 direct to the DSP 126. If no user supplied power is available or practical, an elicited power connection 138 can be made that draws off operating power from the serial network. Some networks mentioned may be more or less able to supply such power demands. It may also be possible to draw some small operating power from the load circuit without actually activating the load.

An Ethernet personality mode, TPI 114 performs the electrical functions required to use an unshielded twisted pair (UTP) cabling system. The ENDEC 116 converts Manchester code to and from NRZ code in compliance with the IEEE 802.3 standards. On packet reception, ENDEC 116 extracts timing signals from incoming packets with a digital phase lock loop (DPLL), and also detects collisions. The MAC 118 enforces the packet integrity of the Ethernet frame. Each contains a MAC receiver and a MAC transmitter. The MAC receivers are substantially different from conventional NIC chips with single Ethernet transceiver channels. The MAC receivers in the MAC 118 check the integrity of incoming packets, and respectively match their destination addresses against a list of pre-loaded addresses in an associated content addressable memory (CAM). If a match occurs, the packet is loaded into a receive FIFO and from there transferred to the host system. Both the source address and the destination address of incoming packet are important in the operation of the NIC device 112. The FIFO array and FIFO manager 120 makes sure that data is not lost during packet transfer between the host and the LAN. The buffer manager 122 uses second generation buffering techniques, e.g., linked lists. The host interface 114 has two parts, a control part and a data part. The control part consists of addressable registers, interrupt lines, a reset signal, and a chip select line. The data part of the interface uses DMA transfers between the FIFO array 120 and the host memory.

The network personality technology described here is conceptually similar to a "software radio" technology employed by Harris Semiconductor. Software radios have a single transceiver system that can handle the various modulation techniques employed for various communications standards, such as GSM, Is-54, etc. These radios employ digital IF processing techniques, e.g., a digital replacement of analog in IF stages which is the digital equivalent of voltage-controlled oscillators, mixers and low-pass filters. Digital IF processing requires high-speed data converters because the A/D is in front of the digital IF stage, instead of at baseband or voiceband point following an analog IF stage. Software radios are under development at virtually all of the major communications system suppliers. Software radio avoids the traditional overhead of multiple components each dedicated to a particular modulation technique. Software radios can change formats by altering coefficients within the digital IF section. For example, a single software radio design can be software-configured to suit either European or U.S. cellular standards, and could even adapt itself appropriately as the user traveled around the world.

Therefore, in actual practice, the whole of NIC 112 may be implemented in hardware with an appropriate DSP chip, and the discrete layers 114–124 may only exist in simulation by the programs contained in the database 128.

Although, the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An addressable solid-state relay (SSR), comprising:
   a process control module with a load output connection and a serial network control input connection;
   a solid-state relay fully disposed in the process control module and connected to switch said load output connection;
   a network client fully disposed in the process control module and connected to said serial network control input connection, and providing for control of the solid-state relay in response to data received from a serial process control network;
   wherein, the solid-state relay is electrically isolated from the network client;
   wherein, the network client is responsive to communications of at least one of Fieldbus, process field bus (PROFIBUS), Seriplex, smart distributed system (SDS), DeviceNet, controller area network (CAN), and Ethernet;
   wherein, the network client automatically configures itself to respond to communications of the at least one of Fieldbus, process field bus (PROFIBUS), Seriplex, smart distributed system (SDS), DeviceNet, controller area network (CAN), and Ethernet;
   wherein, the network client includes a digital signal processor able to respond to communications of the at least one of Fieldbus, process field bus (PROFIBUS), Seriplex, smart distributed system (SDS), DeviceNet, controller area network (CAN), and Ethernet; and
   wherein, the network client includes the digital signal processor and an associated network-personality program database for selectively responding to communications of the at least one of Fieldbus, process field bus (PROFIBUS), Seriplex, smart distributed system (SDS), DeviceNet, controller area network (CAN), and Ethernet.

2. The addressable SSR of claim 1, wherein:
   the network client receives and transmits wireless signals through said serial network control input connection to provide control and status related to the solid-state relay.

* * * * *